United States Patent
Morra

(10) Patent No.: US 8,547,159 B2
(45) Date of Patent: Oct. 1, 2013

(54) CONSTANT VGS ANALOG SWITCH

(75) Inventor: James Joseph Morra, Cape Elizabeth, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 25 days.

(21) Appl. No.: 13/107,491

(22) Filed: May 13, 2011

(65) Prior Publication Data

US 2012/0286845 A1 Nov. 15, 2012

(51) Int. Cl.
*H03K 17/16* (2006.01)
(52) U.S. Cl.
USPC ............ 327/379; 327/389; 327/427; 327/434
(58) Field of Classification Search
USPC ................. 327/362, 379, 389, 419, 427, 434, 327/493, 504, 583, 584; 330/277, 278, 296, 330/299
See application file for complete search history.

(56) References Cited

U.S. PATENT DOCUMENTS

| | | | | |
|---|---|---|---|---|
| 4,093,874 A * | 6/1978 | Pollitt | ............................ | 327/378 |
| 7,002,405 B2 * | 2/2006 | Brooks et al. | .................. | 327/563 |
| 7,427,887 B2 * | 9/2008 | O'Donnell et al. | ........... | 327/434 |
| 7,782,117 B2 | 8/2010 | Stultz et al. | | |
| 2004/0196089 A1 * | 10/2004 | O'Donnell et al. | ........... | 327/437 |
| 2010/0225379 A1 * | 9/2010 | Ramet | ............................ | 327/434 |

FOREIGN PATENT DOCUMENTS

CN 102790608 A 11/2012

* cited by examiner

*Primary Examiner* — Lincoln Donovan
*Assistant Examiner* — Jung H. Kim
(74) *Attorney, Agent, or Firm* — Schwegman Lundberg & Woessner P.A.

(57) ABSTRACT

Apparatus and methods for a switch circuit to provide a substantially constant gate-to source voltage to a passgate are provided. In an example, a switch circuit includes a summing circuit having an output configured to couple to the gate of a passgate, the summing circuit can be configured to maintain a substantially constant voltage between the gate and the source of the pass gate.

8 Claims, 4 Drawing Sheets

CONSTANT VGS ANALOG SWITCH

CROSS-REFERENCE TO RELATED PATENT DOCUMENTS

This patent application is related to Stultz et al. U.S. patent application Ser. No. 12/337,709, now U.S. Pat. No. 7,782,117, entitled "CONSTANT SWITCH VGS CIRCUIT FOR MINIMIZING RFLATNESS AND IMPROVING AUDIO PERFORMANCE," filed on Dec. 18, 2008.

BACKGROUND

Metal oxide semiconductor field-effect transistor (MOSFET) devices can be used as switches for coupling electronic signals. Generally, they demonstrate little or no offset voltages that can be found in bipolar and other solid state switches. Typically, MOSFET switch on resistance ($R_{on}$) is very low and the off resistance ($R_{off}$) is very high. In modern devices, $R_{on}$ can be on the order of an ohm or less and $R_{off}$ can be many megohms. In MOSFET switches, $R_{on}$ can be a function of the gate to source voltage, Vgs, of the device. Since $R_{on}$ is a function of Vgs, $R_{on}$ can be reasonably constant if Vgs is constant, other conditions being equal. When such switch devices are used for audio signals, the fidelity of the transferred signal across the switch can be negatively affected if $R_{on}$ changes with the input signal voltage level. One measure of the audio fidelity of a switch may be the total harmonic distortion (THD) that is introduced by the switch.

Keeping MOSFET $R_{on}$ constant despite input signal voltage variations is an object of Pollitt U.S. Pat. No. 4,093,874, entitled, "Constant Impedance MOSFET Switch" (herein, "the '874 patent"). The '874 patent discusses keeping $R_{on}$ constant by keeping Vgs constant (at a set temperature) regardless of changes of the input signal voltage. The '874 patent, however, uses the logic signal voltage value, which turns the switch on/off, to determine the Vgs voltage level. However, the logic signal voltage value can change as the power supply voltage, which produces the logic signal voltage, changes with a load. Such changes in Vgs can change $R_{on}$ and, thus, limit the useful dynamic range of the '874 patent. In addition, in applications with large negative signal swings, the reliability of a MOSFET can be compromised due to degradation of the MOSFET's gate oxide.

Overview

Apparatus and methods for a switch circuit to provide a constant gate-to-source voltage to a passgate are discussed herein. In an example, a switch circuit includes a summing circuit having an output configured to couple to the gate of a passgate, the summing circuit configured to maintain a substantially constant bias voltage between the gate and the source of the pass gate.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
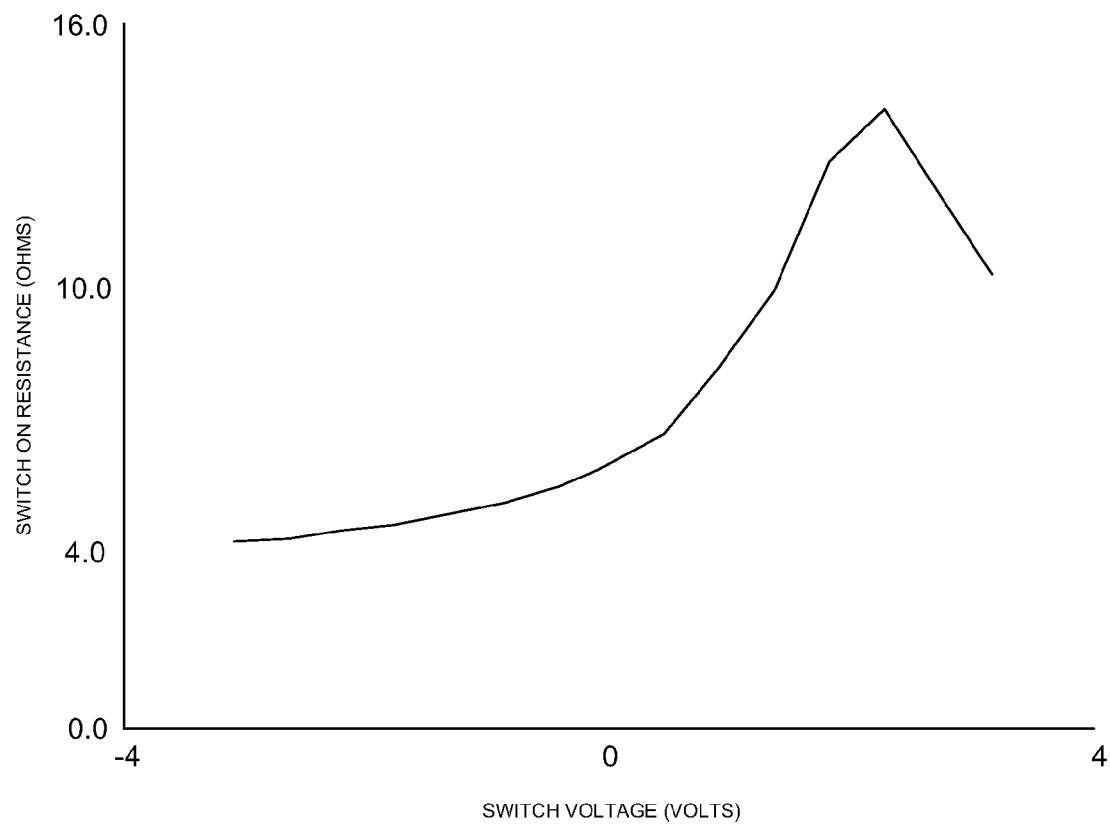
FIG. 1 illustrates generally an example of a relationship, $R_{flatness}$, between passgate on-resistance and voltage at a switched terminal of the passgate as the voltage varies from about −4 volts to about +4 volts for a given control voltage at the control node of the pass-gate.

FIG. 1 illustrates generally an example of a relationship, $R_{flatness}$, between on-resistance and switch voltage at a switched terminal of a passgate as the voltage varies from about −4 volts to about +4 volts for a given control voltage at the control node of the passgate. In this example, the on-resistance varies 10 ohms from about 4 ohms to about 14 ohms over the applied voltage range. For a signal applied to the passgate, such as an audio signal, the change in resistance, $R_{flatness}$, over the applied voltage range can introduce distortion as the passgate passes the signal from one terminal to another.

Stultz et al., U.S. Pat. No. 7,782,117, entitled, "Constant Switch Vgs Circuit for Minimizing $R_{flatness}$ and Improving Audio Performance" (herein, "the '117 patent"), provides a current mirror based circuit to apply a constant gate-to-source voltage, Vgs, to a passgate to improve $R_{flatness}$. The present inventor has recognized various example alternative circuits for providing a constant gate-to-source voltage, Vgs, to a semiconductor passgate, such as a metal oxide semiconductor field effect transistor (MOSFET) passgate. In certain examples, in addition to improving $R_{flatness}$, the example circuits can also provide for a wider range of voltages to be applied to the passgate, including voltages that vary about a voltage reference.

In various examples, the passgate switch circuit for a passgate disclosed herein can provide a constant Vgs such that little or no distortion is caused by the passgate, or can maintain a constant Vgs independent of the polarity of the signal at the switched terminals of the passgate, in certain examples, allowing a larger voltage variation across the passgate without gate oxide degradation. In an example, for a PMOS passgate, a larger positive input voltage can be allowed before the gate oxide degrades, and for an NMOS passgate, a larger negative input voltage can be allowed before the gate oxide degrades.

Figure 2:
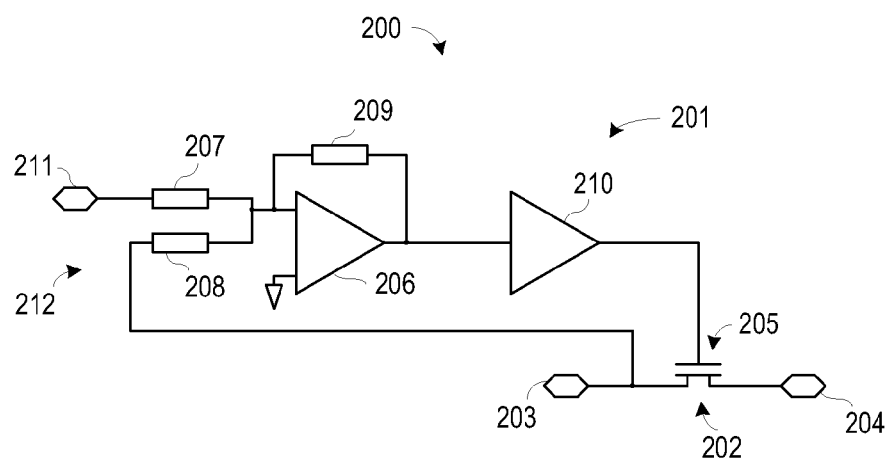
FIGS. 2-5 illustrate generally examples of systems including constant Vgs circuits.

FIG. 2 illustrates generally an example of a system 200 including a constant Vgs circuit 201 and a passgate 202 (e.g., a MOSFET passgate transistor) having first and second switched nodes 203, 204 and a control node 205. The passgate 202 can be coupled to the constant Vgs circuit 201. The constant Vgs circuit 201 can include a summing circuit and an inverter 210. The summing circuit can include an amplifier 206, such as a differential operational amplifier in a summing configuration, first and second input resistors 207, 208, and a feedback resistor 209.

In an example, the constant Vgs circuit 201 can include a first input 211 and a second input 212. A first input 211 of the constant Vgs circuit 201 can receive a control signal, such as a bias voltage, for enabling and disabling the passgate 202. A second input 212 of the constant Vgs circuit 201 can receive the signal at the first switched node 203 of the passgate 202. In an example, the bias voltage and the voltage at the first switched node 203 of the passgate can be summed, amplified, and inverted according to the selection of the resistance values of the first and second input resistors 207, 208 and the feedback resistor 209. In an example, the constant Vgs circuit 201 can maintain a substantially constant voltage level between a control node 205 of the passgate 202, such as a gate of a MOSFET passgate, and one of the switched nodes 203, 204 of the passgate 202, such as a source of a MOSFET passgate. In certain examples, the substantially constant voltage level can be indicative of the voltage of the received control signal.

In an example, the first and second input resistors 207, 208 and the feedback resistor 209 can be selected to provide unity gain, and the inverter 210 can provide the bias voltage at the control node 205 of the passgate 202. In an example, the first switched node 203 can be a source node of a MOSFET passgate, the second switched node 204 can be a drain node of the MOSFET passgate, and the control node 205 can be a gate node of the MOSFET passgate. In such an example, a constant bias voltage can be maintained between the gate and source nodes independent of the polarity or voltage received at the first switched node 203.

Figure 3:
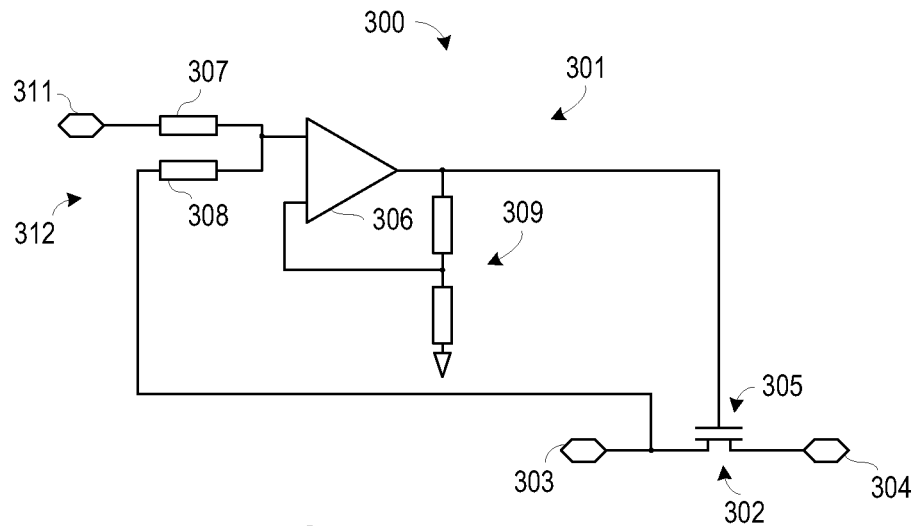

FIG. 3 illustrates generally an example of a system 300 including a constant Vgs circuit 301 and a passgate 302 (e.g., a MOSFET passgate transistor) having first and second switched nodes 303, 304 and a control node 305. The passgate 302 can be coupled to the constant Vgs circuit 301. The constant Vgs circuit 301 can include a summing circuit. The summing circuit can include an amplifier 306, such as a differential operational amplifier, first and second input resistors 307, 308, and a feedback resistor network 309. A first input 311 of the constant Vgs circuit 301 can receive a control signal, such as a bias voltage, for enabling and disabling the passgate 302, and a second input 312 of the constant Vgs circuit 301 can receive the signal at the first switched node 303 of the passgate 302.

In an example, the bias voltage and the voltage at the first switched node 303 can be summed and amplified according to the selected values of the first and second input resistors 307, 308 and the resistor values of the feedback resistor network 309. In an example, the first and second input resistors 307, 308 and the feedback resistor network 309 can be selected to provide a gain of about 2 to provide the bias voltage at the control node 305 of the passgate 302.

In an example, the first switched node 303 of the passgate 302 can be a source node of a MOSFET passgate and the control node 305 of the passgate 302 can be a gate node of the MOSFET passgate. In such an example, the bias voltage can be maintained between the gate and source nodes independent of the polarity and voltage received at the first switched node 303 of the passgate 302.

Figure 4:
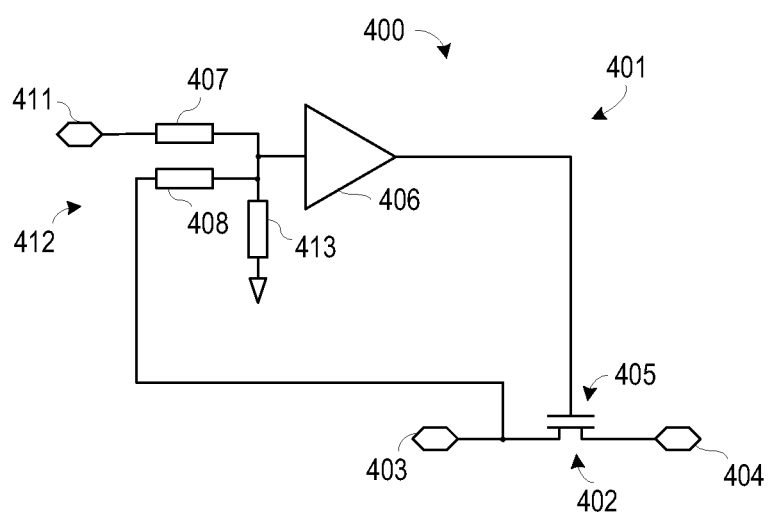

FIG. 4 illustrates generally an example of a system 400 including a constant Vgs circuit 401 and a passgate 402 (e.g., a MOSFET passgate transistor) having first and second switched nodes 403, 404 and a control node 405. In an example, a voltage applied to the control node 405 can modulate resistance between the first and second switched nodes 403, 404. The passgate 402 can be coupled to the constant Vgs circuit 401. The constant Vgs circuit 401 can include an amplifier 406, first and second input resistors 407, 408, and a buffer resistor 413.

In an example, a first input 411 of the constant Vgs circuit 401 can receive a control signal, such as a bias voltage, for enabling and disabling the passgate 402, and a second input 412 of the constant Vgs circuit 401 can receive the signal at the first switched node 403 of the passgate 402. In an example, the bias voltage and the voltage at the first switched terminal 403 of the passgate 402 can be summed and amplified according to the selection of the first and second input resistors 407, 408, the buffer resistor 413, and the gain of the amplifier 406.

In an example, the bias voltage can be provided at the control node 405 of the passgate 402 by selecting the same resistance for each of the first and second input resistors 407, 408 and the buffer resistor 413, and configuring the amplifier 406 to have a gain of 3. In an example, a higher resistance value for the first and second input resistors 407, 408 and the buffer resistor 413 can provide improved harmonic distortion.

In an example, the first switched node 403 of the passgate 402 can include a source node of a MOSFET passgate and the control node 405 of the passgate 402 can include a gate node of the MOSFET passgate. In such an example, the bias voltage can be maintained between the gate and source nodes independent of the polarity or voltage received at the first switched node 403 of the passgate 402.

Figure 5:
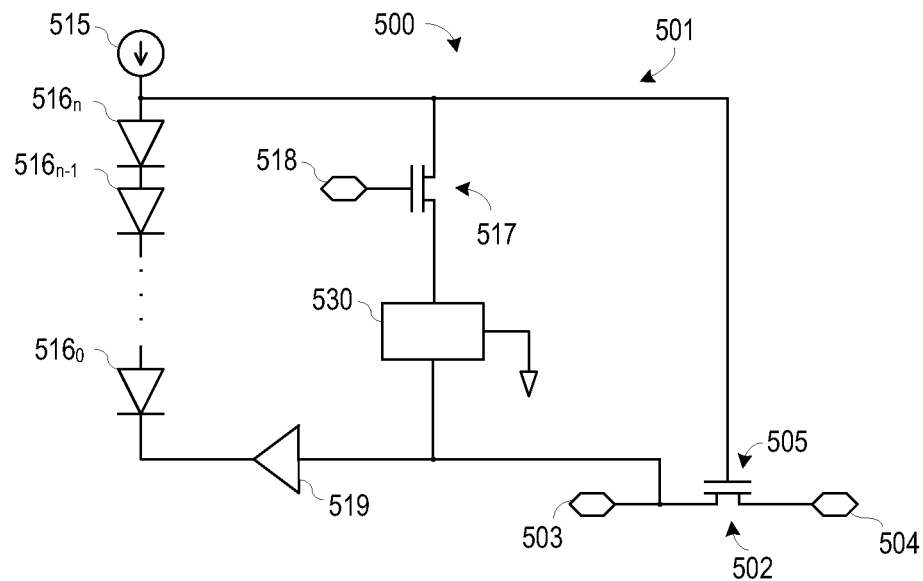

FIG. 5 illustrates generally an example of a system 500 including a constant Vgs circuit 501 and passgate 502 (e.g., a MOSFET passgate transistor) having first and second switched nodes 503, 504 and a control node 505. The passgate 502 can be coupled to the constant Vgs circuit 501. The constant Vgs circuit 501 can include a current source 515, one or more bias diodes 516, and a control switch 517. In an example the control switch 517 can include a control node 518 configured to receive a control signal for enabling or disabling the passgate 502.

In an example, when the passgate 502 is enabled, a low impedance can exist between the first and second switched nodes 503, 504, and when the passgate 502 is disabled, a high impedance can exist between the first and second switched nodes 503, 504. In an example, when the control switch 517 is in a state to disable the passgate 502, the control switch 517 can simulate a short circuit and divert the current from the current source 515 and pull the control node 505 of the passgate 502 to an off-state potential, such as ground. In certain examples, the control switch 517 can be coupled to a low voltage monitoring circuit to divert the current from the current source 515 to the lower of the voltage level at ground or at a switched terminal 503, 504 of the passgate to keep the passgate 502 off when one of the switched nodes, such as a source node of a MOSFET pass gate. In certain examples, a low voltage monitoring circuit 530 can assist in keeping the passgate 502 in an off-state when a switch node, such as a source node of a MOSFET passgate, becomes substantially negative relative to ground. In such an example, in an off-state of the passgate 502, the control voltage of the passgate can be automatically referenced to the lower voltage at either ground or at a switched node of the passgate 502 using the low voltage monitoring circuit 530.

When the control switch 517 is in a state to enable the passgate 502, the control switch 517 can simulate an open circuit, and current from the current source 515 can flow through the one or more bias diodes 516 generating a bias voltage level above the voltage at the first switched node 503 of the passgate 502. In an example, the bias voltage can be applied to the control node 505 of the passgate 502 enabling the passgate 502 and maintaining a constant voltage between the control node 505 and the first switched node 503 of the passgate 502.

In an example, the first switched node 503 of the passgate 502 can be a source node of a MOSFET passgate and the control node 505 of the passgate 502 can be a gate node of the MOSFET passgate. In such an example, the bias voltage can be maintained between the gate and source nodes independent of the polarity and voltage received at the first switched node 503 of the passgate 502. In certain examples, including in the examples of FIGS. 2-4, a buffer 519 can be used to buffer the signal at the first switched terminal 503 of the passgate 502 before or as part of an input to the constant Vgs circuit 501.

Figure 6:
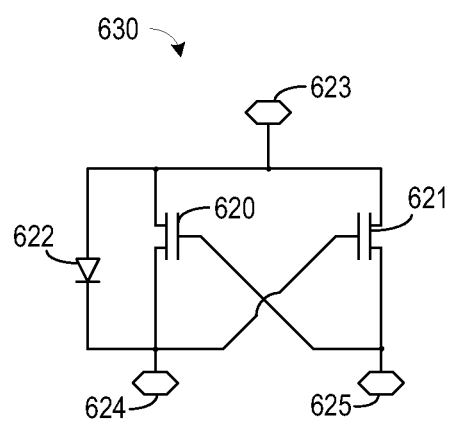
FIG. 6 illustrates generally an example of a low voltage monitoring circuit.

FIG. 6 illustrates generally an example of a low voltage monitoring circuit 630 including a pair of cross coupled transistors 620, 621 and a diode 622. In an example, a first node 623 of the low voltage monitoring circuit 630 can be pulled to the lower voltage present at a second and third node 624, 625 of the low voltage monitoring circuit 630. For example, if the second node 624 is at ground and the third node 625 is substantially negative relative to ground, the second transistor 621 can turn on pulling the first node 623 to the substantially negative voltage at the third node 625. If the third node 625 is higher than ground, the first transistor 620 can turn on pulling the first node 623 to ground. In certain examples, the low voltage monitoring circuit can include a diode 622. The diode can provide a path to ground when both transistors 620, 621 are off and in a high impedance state. It is understood that other low voltage monitoring circuits are possible without departing from the scope of the present subject matter.

Figure 7:
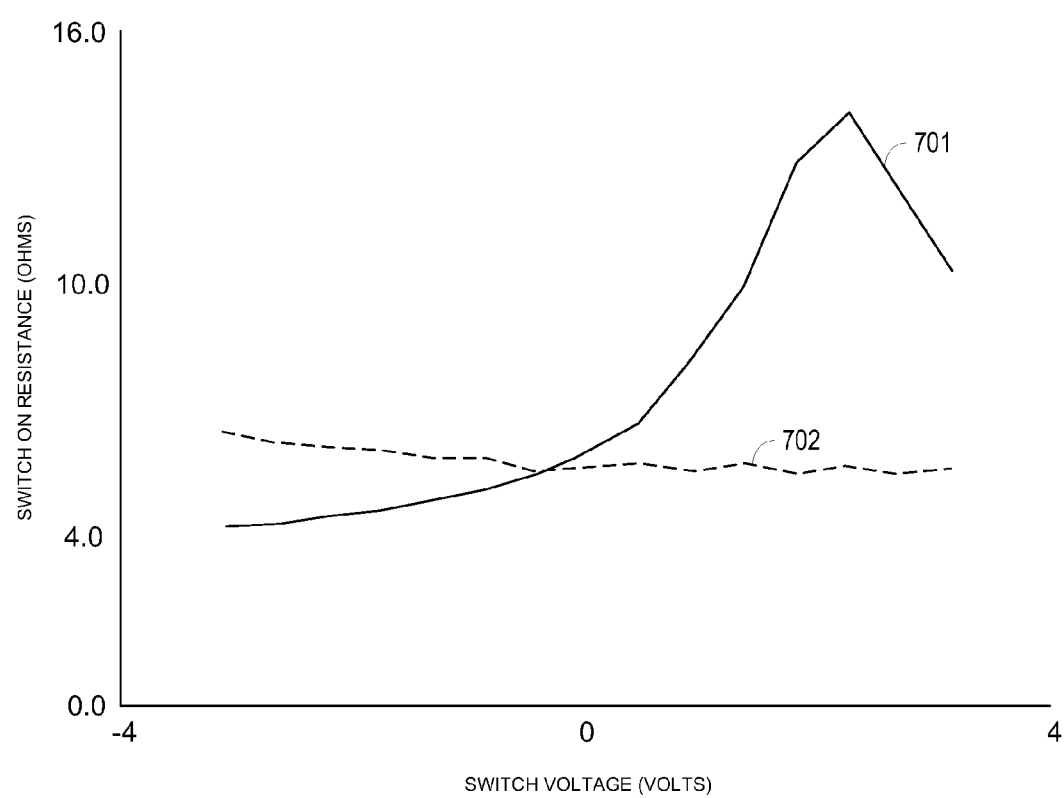
FIG. 7 illustrates generally an example of the improved $R_{flatness}$ that can be obtained using the constant Vgs circuits described herein.

FIG. 7 illustrates generally an example of an improved $R_{flatness}$ that can be obtained using the constant Vgs circuits described herein. The first plot 701 illustrates a relationship, $R_{flatness}$, between on-resistance and switch voltage across a range of applied voltages for a passgate not coupled to a constant Vgs circuit. The first plot 701 shows about a 10 ohm difference in on-resistance over the applied voltage range.

The second plot 702 illustrates a relationship, $R_{flatness}$, between on-resistance and switch voltage across a range of applied voltages for a passgate coupled to a constant Vgs circuit. The second plot 702 shows about a 1 ohm difference in on-resistance over the applied voltage range. Thus, $R_{flatness}$ of a passgate can improve significantly using a constant Vgs circuit according to the present subject matter.

Additional Notes & Examples

In Example 1, a switch circuit can define an on-state and an off-state that, when in the on state, couples a first node to a second node. The switch circuit can include a MOSFET device including a gate, a source coupled to the first node, and a drain coupled to the second node, wherein, when the MOSFET device is in the on state, a signal can pass between the source and the drain. The switch circuit can also include a summing circuit, having an output coupled to the gate of the MOSFET device, configured to maintain a substantially constant control voltage between the gate of the MOSFET device and the source of the MOSFET device during the on-state. The summing circuit can include a current source coupled to the output, a diode network coupled to the current source and at least one of the first or second nodes, the diode network configured to receive current from the current source during the on-state, and a control switch couple to the output, the control switch configured to divert the current from the diode network during the off state.

In Example 2, the switch circuit of Example 1 optionally includes a buffer coupled the diode network and the at least one of the first or second node.

In Example 3, the control switch of any one or more of Examples 1-2 optionally includes a transistor configured to receive a control signal at a gate node of the transistor.

In Example 4, the switch circuit of any one or more of Examples 1-3 optionally includes a low voltage monitoring circuit configured to couple a node of the control switch to a reference voltage, wherein the reference voltage is the lower of ground or a voltage at one of the first or second node.

In example 5, the low voltage monitoring circuit of any one or more of Examples 1-4 optionally includes first and second transistors coupled to the control switch.

In Example 6, the first and second transistors of the low voltage monitoring circuit of any one or more of Examples 1-5 optionally are optionally cross coupled to each other.

In Example 7, the first transistor of any one or more of Examples 1-6 is optionally coupled to ground, and the second transistor of any one or more of Examples 1-6 is optionally coupled to one of the first and second nodes.

In Example 8, a switch circuit can be configured to couple to a gate of a MOSFET and to switch the MOSFET between a low-impedance on state and high-impedance off state, the high and low impedances measured between a first switch node and a second switch node of the MOSFET. The switch circuit can include a summing circuit having an output configured to be coupled to the gate of the MOSFET and to maintain a substantially constant control voltage between the gate of the MOSFET and the first switch node during the on-state, and a control switch coupled to the output. The summing circuit can include a current source coupled to the output and a diode network coupled to the current source and at least one of the first or second nodes, the diode network configured to receive current from the current source during the on-state; the control switch configured to divert the current from the diode network during the off state. The control switch can be configured to divert the current from the diode network during the off state.

In Example 9, the switch circuit of any one or more of Examples 1-8 optionally includes a buffer coupled to the diode network and the at least one of the first or second node.

In Example 10, the control switch any one or more of Examples 1-9 optionally includes a transistor configured to receive a control signal at a gate node of the transistor.

In Example 11, the switch circuit of any one or more of Examples 1-10 optionally includes a low voltage monitoring circuit configured to couple a node of the control switch to a reference voltage, wherein the reference voltage is the lower of ground or a voltage at one of the first or second node.

In Example 12, the low voltage monitoring circuit any one or more of Examples 1-11 optionally includes first and second transistors coupled to the control switch.

In Example 13, the first and second transistors of the low voltage monitoring circuit any one or more of Examples 1-12 are optionally cross coupled to each other.

In Example 14, the first transistor any one or more of Examples 1-13 is optionally coupled to ground and the second transistor is optionally coupled to one of the first and second nodes.

In Example 15, a method includes receiving information at a first switch node of a MOSFET switch, providing a current to generate a control signal of the MOSFET switch, passing the current through a diode network coupled to a gate node of the MOSFET switch and to the first switch node, the current configured to generate a first state of the control signal, the first state of the control signal configured to pass the information from the first switch node to a second switch node of the MOSFET switch, and diverting the current from the diode network to a reference, the diverted current configured to generate a second state of the control signal, the second state of the control signal configured to isolate the first switch node from the second switch node at the MOSFET switch.

In Example 16, the passing the current through the diode network any one or more of Examples 1-15 optionally includes maintaining a substantially constant first control voltage level between the gate of the MOSFET device and the source of the MOSFET device in the first state of the control signal.

In Example 17, the diverting the current from the diode network to a reference any one or more of Examples 1-16 optionally includes maintaining a second control voltage level between the gate of the MOSFET device and the source of the MOSFET device in the second state of the control signal.

In Example 18, the method any one or more of Examples 1-17 optionally includes buffering the current from the first switch node.

In Example 19, the diverting the current from the diode network to a reference any one or more of Examples 1-18 optionally includes diverting the current from the diode network to ground when a voltage at the first node is greater than ground.

In Example 20, the diverting the current from the diode network to a reference any one or more of Examples 1-19 optionally includes diverting the current from the diode network to the first node when a voltage at the first node is less than ground.

In Example 21, a switch circuit defines an on state and an off state that, when in the on state, couples a first node to a second node. The circuit includes a MOSFET device including a gate, a source coupled to the first node, and a drain coupled to the second node. When the MOSFET device is in the on state, a signal can pass between the source and the drain. The circuit includes a summing circuit, having an output coupled to the gate of the MOSFET device, configured to maintain a bias voltage between the gate of the MOSFET device and the source of the MOSFET device. The summing circuit includes an amplifier having an amplifier output coupled to the output of the summing circuit, a first resistor configured to couple a first input of the amplifier to the bias voltage, and a second resistor configured to couple the first input of the amplifier to the first node.

In Example 22, the summing circuit any one or more of Examples 1-21 is optionally configured to provide a substantially constant voltage level between the gate of the MOSFET device and the source of the MOSFET device.

In Example 23, the switch circuit of any one or more of Examples 1-22 optionally includes a third resistor configured to couple the first input of the amplifier to the amplifier output.

In Example 24, the first input of the amplifier any one or more of Examples 1-23 optionally includes an inverting input, and a second input of the amplifier optionally includes a non-inverting input.

In Example 25, the switch circuit of any one or more of Examples 1-24 optionally includes an inverter coupled between the output of the summing circuit and the output node.

In Example 26, the inverter any one or more of Examples 1-25 optionally includes an inverting amplifier having unity gain.

In Example 27, the switch circuit of any one or more of Examples 1-26 optionally includes a third resistor configured to couple a second input of the amplifier to the amplifier output.

In Example 28, the first input any one or more of Examples 1-27 optionally includes a non-inverting input of the amplifier and the second input includes an inverting input of the amplifier.

In Example 29, the switch circuit of any one or more of Examples 1-28 optionally includes a third resistor configured to couple the first input of the amplifier to a reference potential, and wherein the first input of the amplifier includes a non-inverting input.

In Example 30, the first, second, and third resistors of any one or more of Examples 1-29 optionally have substantially the same resistance value and the amplifier optionally includes a gain of about 3.

In Example 31, a switch circuit is configured to couple to a gate of a MOSFET and to switch the MOSFET between a low-impedance on state and high-impedance off state, the high and low impedances measured between a first switch node and a second switch node of the MOSFET. The switch circuit includes a summing circuit having an output configured to be coupled to the gate of the MOSFET and to maintain a bias voltage between the gate of the MOSFET and the first switch node. The summing circuit includes an amplifier having an amplifier output coupled to the output of the summing circuit, a first resistor configured to couple a first input of the amplifier to the bias voltage, and a second resistor configured to couple the first input of the amplifier to the first switch node.

In Example 32, the summing circuit any one or more of Examples 1-31 is optionally configured to provide a substantially constant voltage level between the gate of the MOSFET device and the source of the MOSFET device.

In Example 33, the switch circuit of any one or more of Examples 1-32 optionally includes a third resistor configured to couple the first input of the amplifier to the amplifier output.

In Example 34 the first input of the amplifier any one or more of Examples 1-33 optionally includes an inverting input, and a second input of the amplifier optionally includes a non-inverting input.

In Example 35, the switch circuit of any one or more of Examples 1-34 optionally includes an inverter coupled between the output of the summing circuit and the output node.

In Example 36, the inverter any one or more of Examples 1-35 optionally includes an inverting amplifier having unity gain.

In Example 37, the switch circuit of any one or more of Examples 1-36 optionally includes a third resistor configured to couple a second input of the amplifier to the amplifier output.

In Example 38, the first input any one or more of Examples 1-37 optionally includes a non-inverting input of the amplifier and the second input optionally includes an inverting input of the amplifier.

In Example 39, the switch circuit of any one or more of Examples 1-38 optionally includes a third resistor configured to couple the first input of the amplifier to a reference potential.

In Example 40, the first, second, and third resistors any one or more of Examples 1-39 optionally have substantially the same resistance value and the amplifier optionally includes a gain of about 3.

In Example 41, a method includes receiving a signal at a source of a MOSFET device, receiving a bias voltage at a summing circuit, the summing circuit including an amplifier, summing the bias voltage and the received signal using the amplifier to provide a control voltage, and applying the control voltage to a gate of the MOSFET device.

In Example 42, the applying the control voltage to the gate of the MOSFET device any one or more of Examples 1-41 optionally includes maintaining a substantially constant voltage level between the gate of the MOSFET device and the source of the MOSFET device during an on-state of the MOSFET device.

In Example 43, the method any one or more of Examples 1-42 optionally includes buffering an output of the amplifier to generate the control voltage.

In Example 44, the buffering any one or more of Examples 1-43 optionally includes inverting the output of the amplifier to generate the control voltage.

Example 45 can include, or can optionally be combined with any portion or combination of any portions of any one or more of Examples 1-44 to include, subject matter that can include means for performing any one or more of the functions of Examples 1-44, or a machine-readable medium including instructions that, when performed by a machine, cause the machine to perform any one or more of the functions of Examples 1-44.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A switch circuit defining an on-state and an off-state that, when in the on state, couples a first node to a second node, the circuit comprising:
    a MOSFET device including:
        a gate,
        a source coupled to the first node; and
        a drain coupled to the second node;
    wherein, when the MOSFET device is in the on state, a signal can pass between the source and the drain;
    a summing circuit having an output coupled to the gate of the MOSFET device, the summing circuit including:
        a current source coupled to the output;
        a diode network coupled between the current source and the first node, the diode network configured to receive current from the current source during the on-state and to maintain a substantially constant control voltage between the gate of the MOSFET device and the source of the MOSFET device during the on-state; and
        a control switch coupled to the output, the control switch configured to divert the current from the diode network during the off state; and
    a low voltage monitoring circuit configured to couple a node of the control switch to a reference voltage, the low voltage monitoring circuit including first and second transistors coupled to the control switch, wherein the first and second transistors are cross coupled to each other, and wherein the reference voltage is the lower of ground or a voltage at one of the first or second nodes.

2. The switch circuit of claim 1, including a buffer coupled the diode network and the at least one of the first or second node.

3. The switch circuit of claim 1, wherein the control switch includes a transistor configured to receive a control signal at a gate node of the transistor.

4. The switch circuit of claim 1, wherein the first transistor is coupled to ground; and
wherein the second transistor is coupled to one of the first and second nodes.

5. A switch circuit configured to couple to a gate of a MOSFET and to switch the MOSFET between a low-impedance on state and high-impedance off state, the high and low impedances measured between a first switch node and a second switch node of the MOSFET, the switch circuit comprising:
- a summing circuit having an output configured to be coupled to the gate of the MOSFET, the summing circuit including:
  - a current source coupled to the output; and
  - a diode network coupled between the current source and the first node, the diode network configured to receive current from the current source during the on-state and to maintain a substantially constant control voltage between the gate of the MOSFET and the first switch node during the on-state;
- a control switch coupled to the output, the control switch configured to divert the current from the diode network during the off state;
- a low voltage monitoring circuit configured to couple a node of the control switch to a reference voltage, wherein the reference voltage is the lower of ground or a voltage at one of the first or second node;
- wherein the low voltage monitoring circuit includes first and second transistors coupled to the control switch; and
- wherein the first and second transistors of the low voltage monitoring circuit are cross coupled to each other.

6. The switch circuit of claim 5, including a buffer coupled to the diode network and the first node.

7. The switch circuit of claim 5, wherein the control switch includes a transistor configured to receive a control signal at a gate node of the transistor.

8. The switch circuit of claim 5, wherein the first transistor is coupled to ground; and
wherein the second transistor is coupled to one of the first and second nodes.

* * * * *